United States Patent
Wilford et al.

[11] Patent Number: 6,163,500
[45] Date of Patent: *Dec. 19, 2000

[54] MEMORY WITH COMBINED SYNCHRONOUS BURST AND BUS EFFICIENT FUNCTIONALITY

[75] Inventors: John R. Wilford; Dean Gans, both of Boise, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 09/389,313

[22] Filed: Sep. 2, 1999

Related U.S. Application Data

[63] Continuation of application No. 09/034,203, Mar. 3, 1998, Pat. No. 5,978,311.

[51] Int. Cl.[7] .................................... G11C 8/00
[52] U.S. Cl. ............................ 365/230.08; 365/233
[58] Field of Search ................. 365/238.5, 194, 365/233, 230.08, 189.02

[56] References Cited

U.S. PATENT DOCUMENTS

| | | | |
|---|---|---|---|
| 4,825,416 | 4/1989 | Tam et al. | 365/194 |
| 5,261,064 | 11/1993 | Wyland | 395/400 |
| 5,327,390 | 7/1994 | Takasugi | 365/230 |
| 5,361,343 | 11/1994 | Kosonocky et al. | 395/425 |
| 5,390,149 | 2/1995 | Vogley et al. | 365/189.01 |
| 5,617,555 | 4/1997 | Patel et al. | 395/432 |
| 5,623,624 | 4/1997 | Holland et al. | 395/432 |
| 5,721,859 | 2/1998 | Manning | 397/421.07 |
| 5,787,489 | 7/1998 | Pawloski | 711/169 |
| 5,978,311 | 11/1999 | Wilford et al. | 365/233 |

OTHER PUBLICATIONS

"2.25Mb ZBT SRAM Product Specifications", *Micron Technology, Inc.*, (Sep. 1997).

"Syncburst SRAM Product Guide", *Micron Technology, Inc.*, (Feb. 1998).

*Primary Examiner*—David Nelms
*Assistant Examiner*—Gene N. Auduong
*Attorney, Agent, or Firm*—Schwegman, Lundberg, Woessner & Kluth, P.A.

[57] ABSTRACT

A memory device is described which is operable in both a synchronous mode and a bus efficient mode (BE). Address and data register circuitry provide multiple propagation paths which can be selected based upon the operating mode and function performed. These features allow one memory device to be manufactured for multiple commercial applications. The address and data register circuitry have first and second paths, wherein the second paths are longer than the first paths. Control circuitry is provided to select the desired paths. During a synchronous and BE read operations, the first path of both the address and data register circuitry is selected. During BE write operations, the second path of the address register circuitry is selected. If the BE is operating in non-pipelined mode, the second path of the data register circuitry is selected. Finally, if the BE is operating in pipelined mode, the first path of the data register circuitry is selected following a write operation, and the second path of the data register circuitry is selected following a read operation.

21 Claims, 11 Drawing Sheets

MEMORY WITH COMBINED SYNCHRONOUS BURST AND BUS EFFICIENT FUNCTIONALITY

This application is a continuation of U.S. Ser. No. 09/034,203 filed Mar. 3, 1998 U.S. Pat. No. 5,978,311.

TECHNICAL FIELD OF THE INVENTION

The present invention relates generally to static memory devices and in particular the present invention relates to a memory device which combines multiple data communication operations in a common integrated circuit.

BACKGROUND OF THE INVENTION

Modern memory devices are available in numerous configurations with different operating specifications. For example, dynamic, static and non-volatile memories are available in multiple architectures and can be operated in different modes. Those skilled in the art will recognize page mode, synchronous, burst, pipe line, and bus efficient (BE) as examples of different data communication operations commercially available.

One type of memory is the static random access memory (SRAM). An SRAM is designed to store data in memory cells formed as a static latch circuit. This type of memory does not require the data refresh operations necessary in a conventional DRAM. The SRAM, however, requires additional integrated die area to fabricate a memory cell.

With the constant development of faster computer and communication applications, the data rates in which a memory circuit must operate continue to increase. To address the need for increased data rates, a variety of memories are produced in a variety of designs which provide different methods of reading from and writing to the memory cells of the memory. Page mode operations are defined by the method of accessing a row of a memory cell array and randomly accessing different columns of the array. Data stored at the row and column intersection can be read and output while that column is accessed. Page mode memories require access steps which limit the communication speed of the memory circuit.

Another type of memory is a burst access memory which receives one address of a memory array on external address lines and automatically addresses a sequence of columns without the need for additional column addresses to be provided on the external address lines. By reducing the external address input signals, burst memory circuits are capable of outputting data at significantly faster communication rates than the above described memory circuits.

Synchronous memory devices, either dynamic or static, operate in synchronization with an externally provided clock signal and can typically function in burst read and write modes to reduce external address input signals. Synchronous burst SRAM devices, known as PB1 and PB2, are also available as pipelined and non-pipelined (flow-through) devices. Inactive data bus times are often experienced when changing the operation of an SRAM from a write operation to a read operation. This "idle" bus time is eliminated in bus efficient (BE) memory devices. These memories receive external addresses one or more clock cycles prior to its corresponding data.

The above described synchronous and BE memories are manufactured and sold as separate devices which require specifically designed integrated circuits. For the reasons stated above, and for other reasons stated below which will become apparent to those skilled in the art upon reading and understanding the present specification, there is a need in the art for a single integrated circuit memory device which can be operated in either synchronous or bus efficient (BE) modes.

SUMMARY OF THE INVENTION

The above mentioned problems with integrated circuit memory devices and other problems are addressed by the present invention and which will be understood by reading and studying the following specification. A memory device is described which is operable in both a synchronous mode and a bus efficient mode.

In particular, the present invention describes an integrated memory circuit comprising address register circuitry having first and second address propagation paths, input data register circuitry having first and second data propagation paths, and control circuitry coupled to the address register circuitry and the input data register circuitry to control the address and input data propagation paths. The integrated memory circuit can operate in either a synchronous mode, or a bus efficient mode.

In another embodiment a static random access memory (SRAM) is provided that is operable in both a synchronous mode and a bus efficient mode. The SRAM comprises an array of static memory cells, an address input connection coupled to an external address bus, a data input connection coupled to an external data bus, and an address register circuit having an input coupled to the address input connection. The address register circuit comprises first and second address propagation paths from the address input connection to an output of the address register circuit. The first address propagation path is adapted to couple an address from the address input connection to the output of the address register circuit within one system clock cycle. The second address propagation path is adapted to couple an address from the address input connection to the output of the address register circuit in more than one system clock cycle. A data register circuit is provided and coupled to the data input connection. The data register circuit comprises first and second data propagation paths from the data input connection to an output of the data register circuit. The first data propagation path is adapted to couple data provided on the data input connection to the output of the data register circuit within one system clock cycle. The second data propagation path is adapted to couple data provided on the data input connection to the output of the data register circuit in more than one system clock cycle. The SRAM further includes control circuitry coupled to the address register circuit and the data register circuit for controlling address and data propagation path selection.

A static random access memory (SRAM) is provided that comprises address register circuitry having a plurality of address propagation paths, input data register circuitry having a plurality of data propagation paths, and control circuitry coupled to the address register circuitry and the input data register circuitry to control the address and input data propagation paths. The SRAM can be operated in either a mode where data provided on an external data line is synchronized with a corresponding memory address, or a mode where data provided on an external data line lags a corresponding memory address.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

This invention concerns electrical circuitry which uses voltages to represent the two binary logic levels. The words "low" and "high" in this specification refer generally to the false and true binary logic levels, respectively. Signals are generally considered active when they are high, however, a pound sign (#) following the signal name in this application indicates that the signal is negative or inverse logic. Negative or inverse logic is considered active when the signal is low.

The present invention provides an integrated circuit memory device which can be operated as either a synchronous memory, a bus efficient (BE) pipelined memory, or a BE non-pipelined memory. Register and control circuitry are provided on a single integrated circuit which allows the memory device to be operated in any one of the different modes. As such, a single die can be manufactured for multiple applications. In one embodiment, the memory device is provided to an end user which selects the mode of operation. Prior to describing specific embodiments of circuitry which allows the memory to function in one of a number of modes, a general description of an SRAM which incorporates the present invention is provided.

Figure 1:
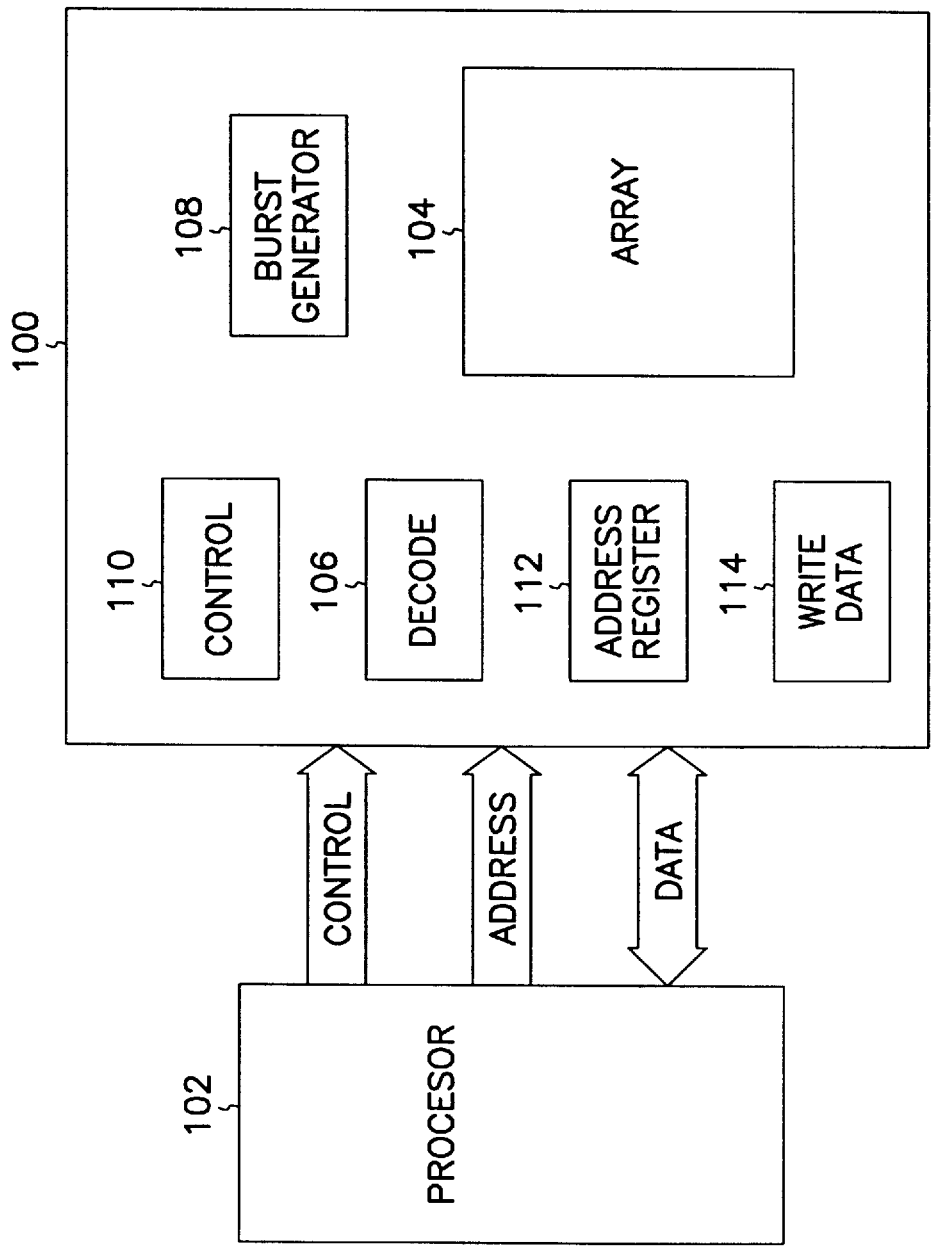
FIG. 1 is a block diagram of a memory device of the present invention.

Referring to FIG. 1, an SRAM 100 is illustrated which incorporates the present invention and can be operated as either a synchronous memory or a BE memory. The memory is coupled to an external processor or controller 102 via control signals, address bus signals, and data bus lines. It is contemplated that the SRAM can be used as a cache memory in a processing system. The communication timing between the address signals and the data signals differentiate the different modes of the memory device, as described below. The memory device includes an array of static memory cells 104, as known to those skilled in the art, and addressing circuitry 106 for decoding externally provided address signals. The memory includes a burst address generator 108 for providing internally generated addresses during a burst read or write mode. The memory further includes control circuitry 110 for operating the memory device in response to external control signals, and address and input data register circuitry 112 and 114, respectively, for operating the memory in either synchronous or BE modes. Those skilled in the art will understand that the memory has been simplified to focus on the present invention and is not intended to provide a comprehensive description of all the operations and features of the SRAM device.

Synchronous and BE Memory Operation

Figure 2:
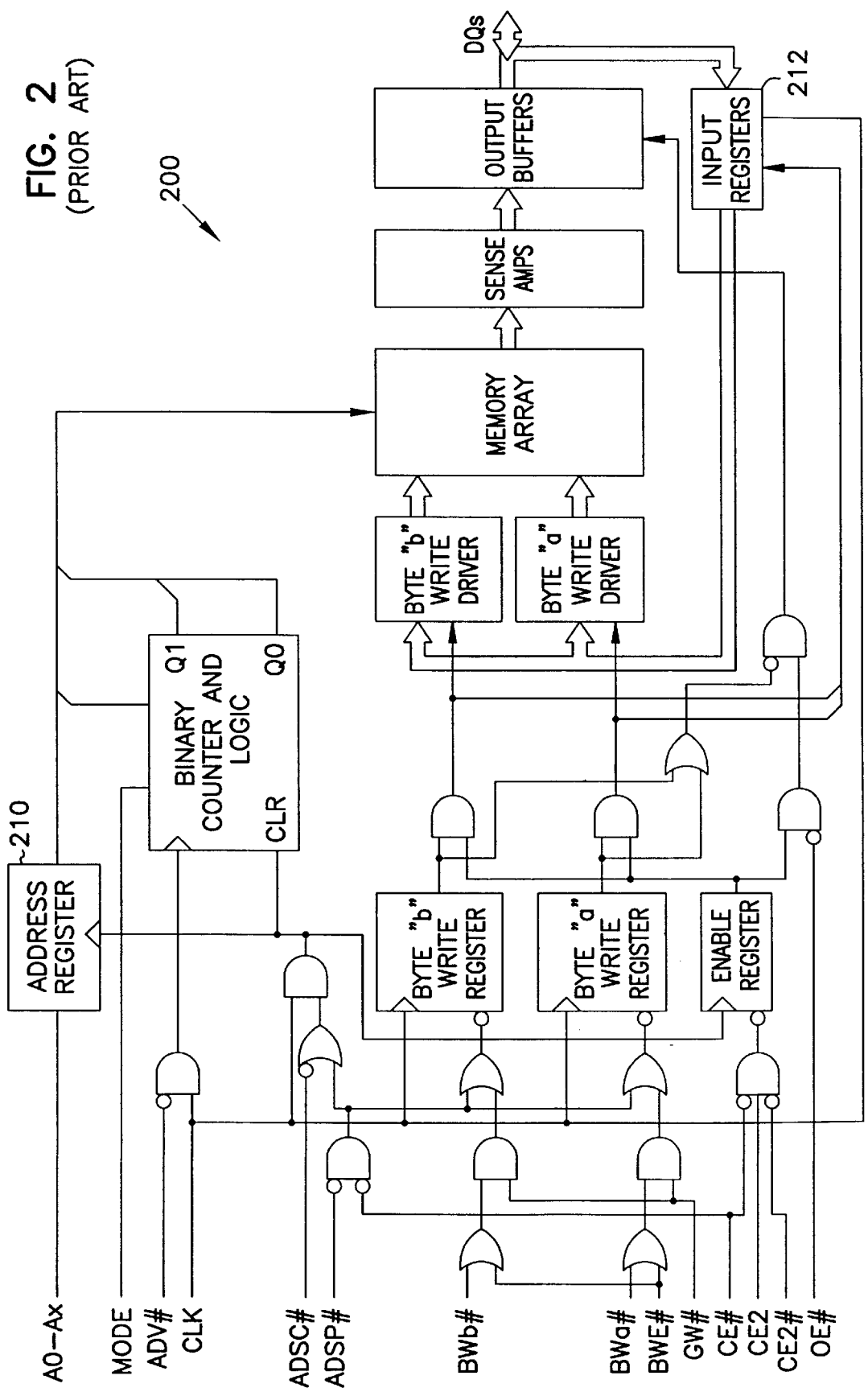
FIG. 2 is a block diagram of a portion of a prior art synchronous memory device.

FIG. 2 provides a functional block diagram of a prior art synchronous non-pipelined memory device 200. The memory device includes an address register 210 and an input data register 212. As known in the art, during a write operation, data corresponding to a specified address is received by the memory during the same clock cycle as the address. As such, when the memory performs a read operation followed by a write operation, one or more idle cycles are experienced on the data communication bus before valid output data is provided.

Figure 3:
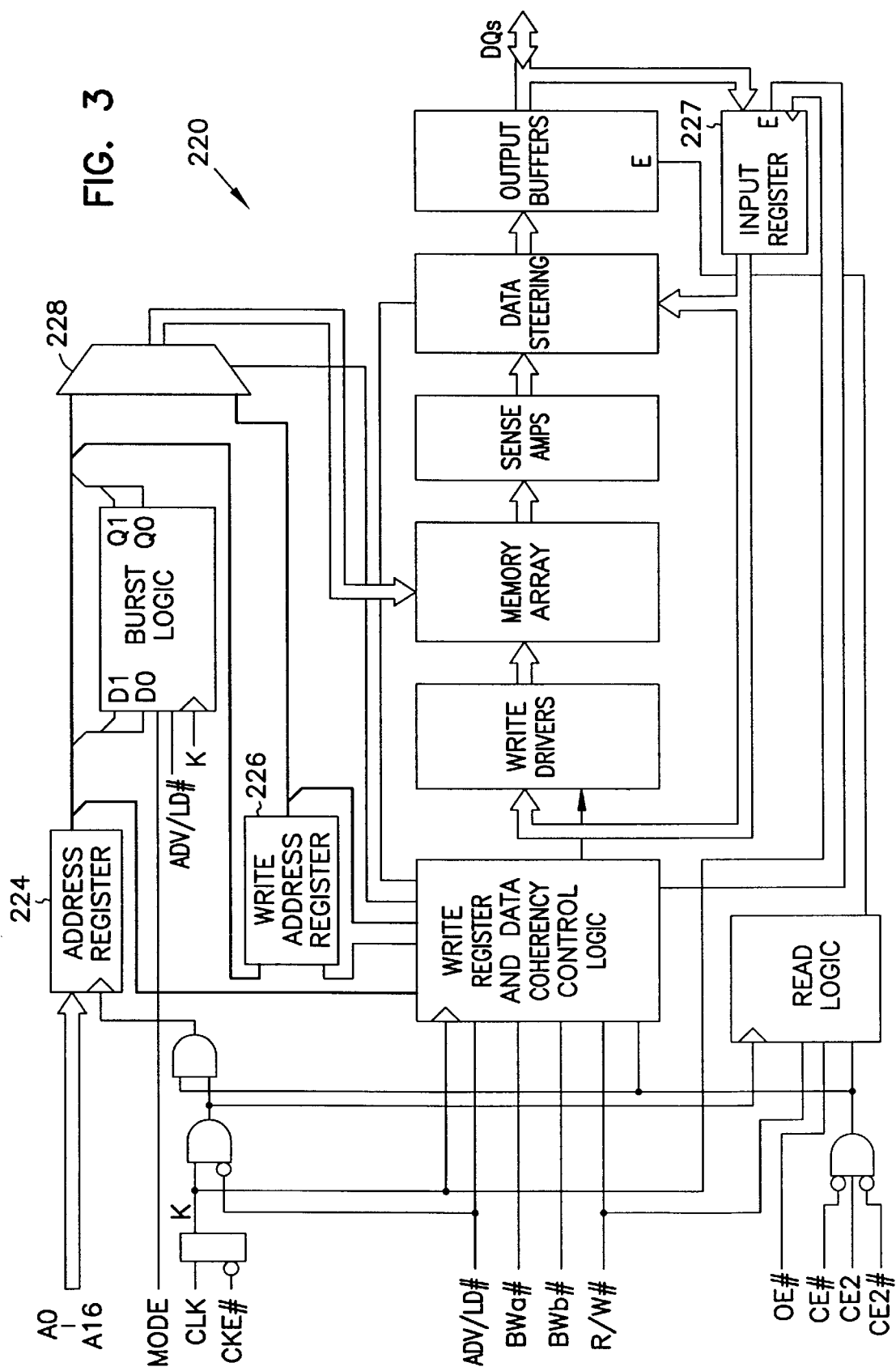
FIG. 3 is a block diagram of a portion of a BE non-pipelined synchronous memory device.

FIG. 3 provides a functional block diagram of a synchronous bus efficient non-pipelined memory device 220, also known as a late-write memory. This memory includes an address register 224, a write address register 226 and an input data register 227. During a read operation the external address is processed through the address register and a multiplex circuit 228 During a write operation, the external write address is processed through the write address register 226 to delay the address signal by at least one clock cycle to correspond with data provided on the data bus. That is, write addresses and corresponding data are transmitted out of synchronization with each other in a BE memory. The memory, therefore, must synchronize the address and data during a write operation. Further, the BE memory delays writing data to the memory if a read operation is performed, as explained below.

Figure 4:
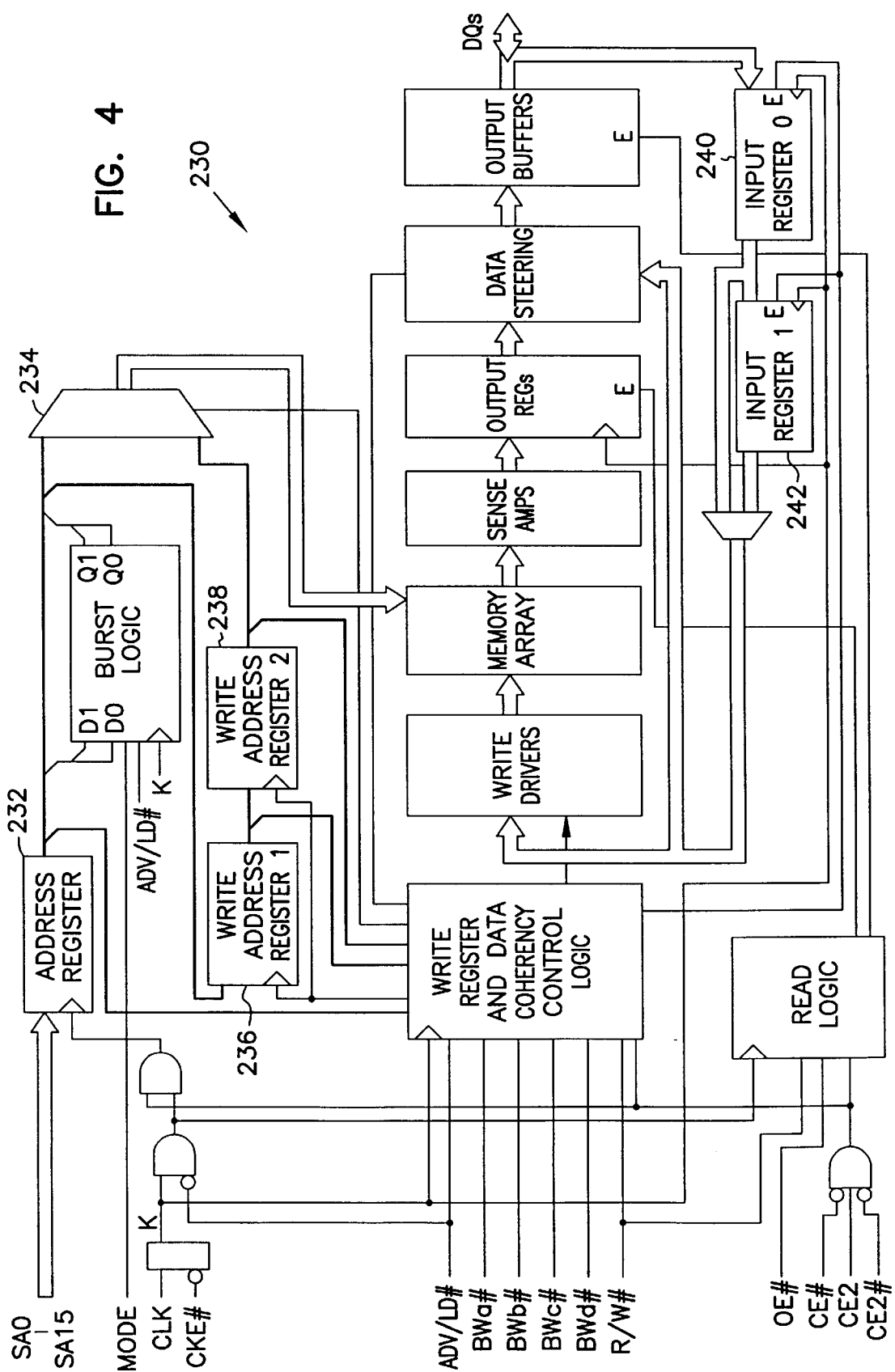
FIG. 4 is a block diagram of a portion of a BE pipelined synchronous memory device.

FIG. 4 provides a functional block diagram of a synchronous bus efficient pipelined memory device 230, also known as a late-late-write memory. This memory includes an address register 232, and two write address registers 236 and 238, and two input data registers 240 and 242. During a read operation the external address is processed through the address register 232 and a multiplex circuit 234. During a write operation, the write address is processed through the write address registers 236, 238 to delay the address signal by at least two clock cycles to correspond with data provided on the data bus. As stated above, write addresses and corresponding data are transmitted out of synchronization with each other in a BE memory, and the BE memory delays writing data to the memory if a read operation is performed, as explained below. The term pipelined as used herein is defined by the correspondence of output data on a read operation to its address. That is, in a non-pipelined mode the output data is presented to the data bus on the same cycle that the address is received on the address bus, and in a pipelined mode the output data is presented to the data bus on the cycle following the cycle that the address is received on the address bus.

Address and Data Register Circuitry

The present memory device includes register circuitry which can be controlled to allow the memory to function as either a synchronous memory or a BE memory. The following description provides details of at least one embodiment of the present invention.

Figure 5:
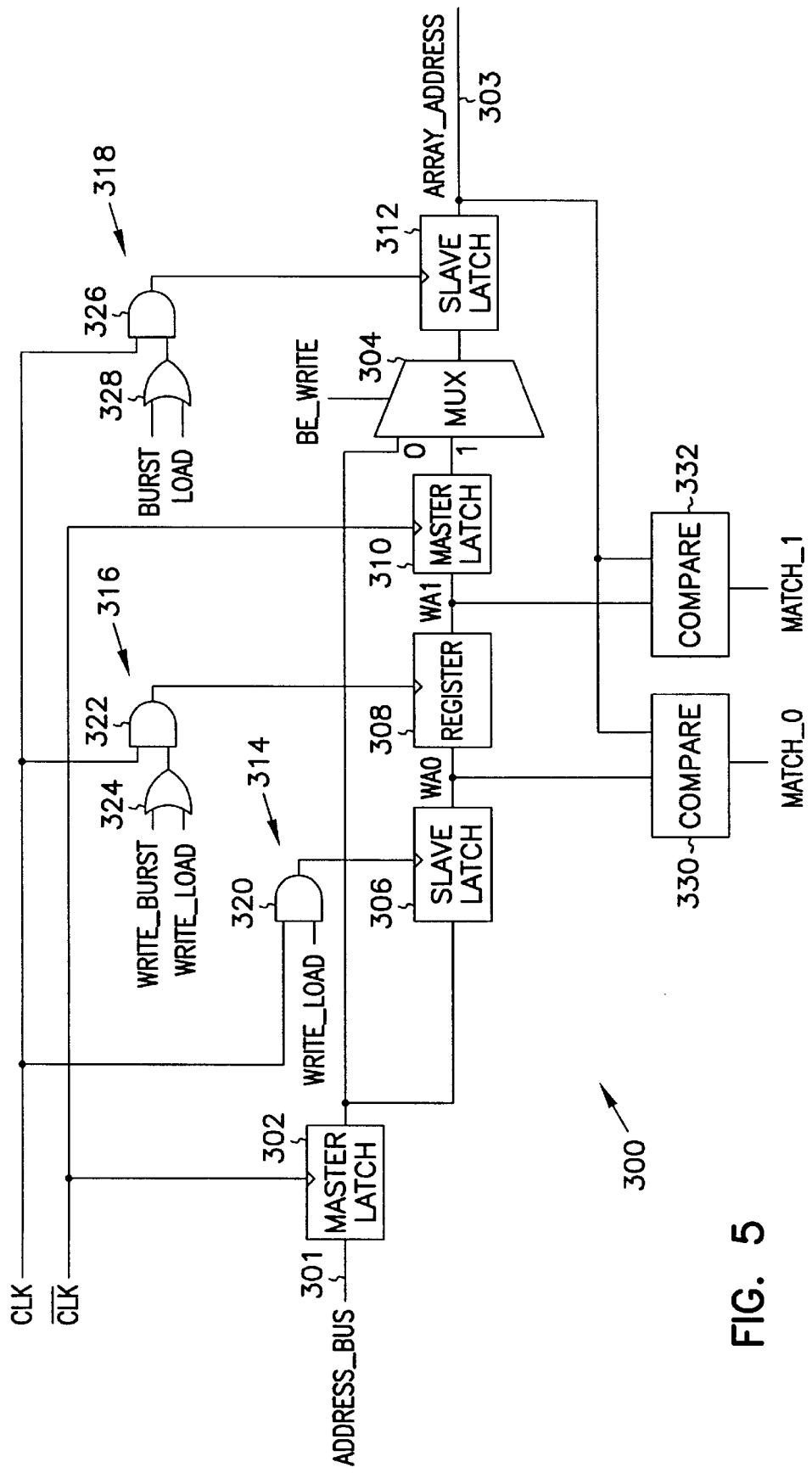
FIG. 5 is a schematic diagram of an address register circuit of the present invention.

Referring to FIG. 5, a schematic diagram of a non-burst synchronous address register 300 is provided. It will be appreciated that some address lines will not be advanced during burst operations. For example, a burst length of four addresses requires that only the two least significant address be advanced. The address register provides two address paths from address bus 301 to memory array address line 303. The first address path is defined by master latch 302, multiplex circuit 304 and slave latch 312. This path is used during synchronous operation and BE read operations. During a BE write operation, an externally provided address is routed through master latch 302, slave latch 306, register 308, and master latch 310 to multiplex circuit 304. The input (1) of the multiplex circuit is then coupled to array address line 303 through slave latch 312. Control of address register 300 allows the memory to function as either a synchronous memory or a BE memory, both options can function as pipelined or non-pipelined. Because write addresses can be latched during a BE read operation, compare circuitry 330 and 332 is provided to allow the memory to identify if a latched address is desired to be read.

Slave latch 306 is activated by circuit 314 in response to the system clock signal, Clk, and a Write Load command. Likewise, register 308 is activated by circuit 316 in response to the system clock signal and either the Write_Load or Write_Burst command. Slave latch 312 is controlled by circuit 318 in a like manner in response to clock and either a Load or Burst signal.

Figure 6:
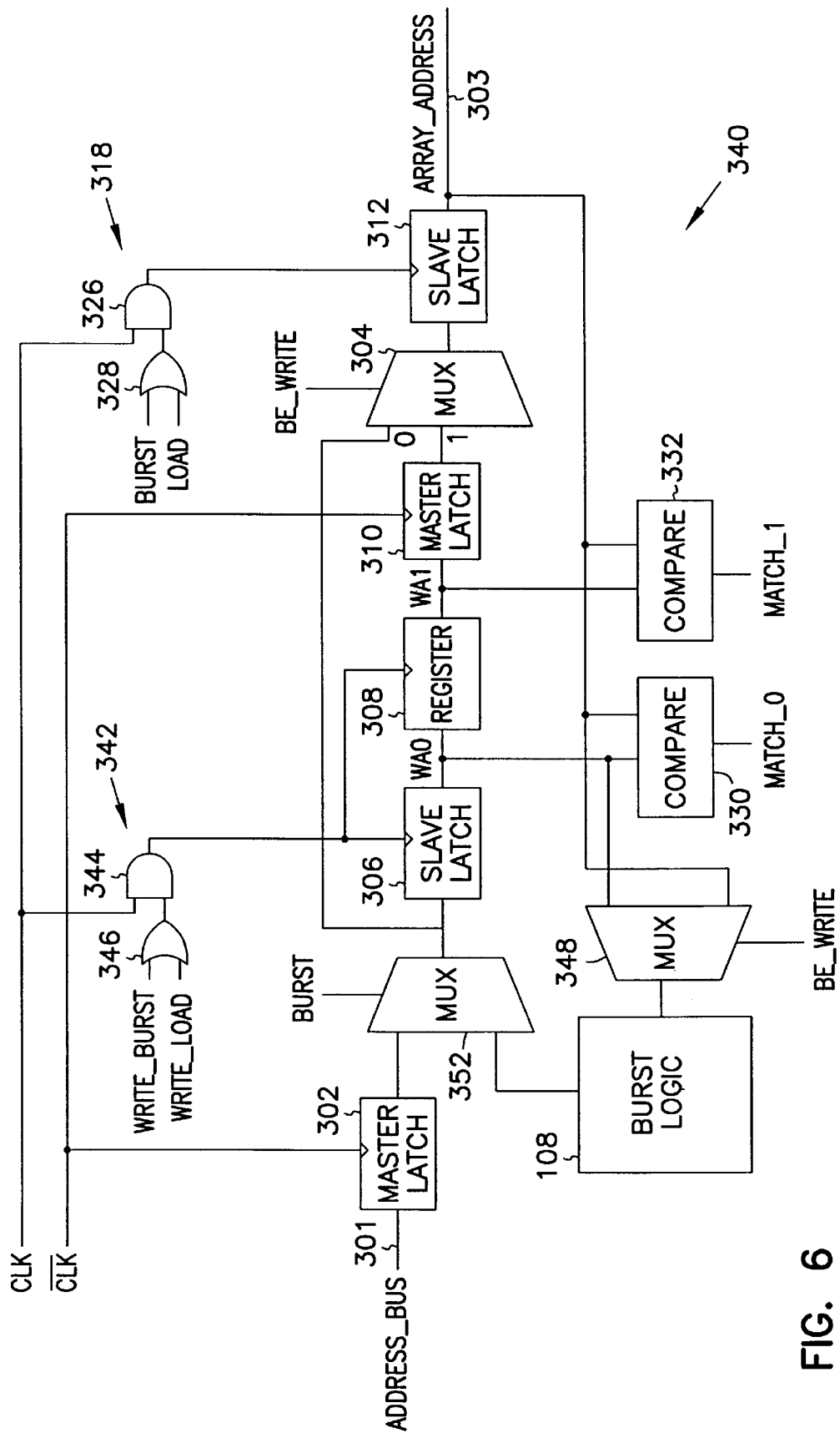
FIG. 6 is a schematic diagram of another embodiment of an address register circuit of the present invention.

Referring to FIG. 6, a schematic diagram is provided of an address register 340 which is adapted to allow burst addresses. That is, the address register of FIG. 6 is coupled to the address lines which are advanced by burst addresses generator 108. The address register also provides two address paths from address bus 301 to memory array address line 303. The first address path is defined by master latch 302, multiplex circuit 352, multiplex circuit 304 and slave latch 312. This path is used during synchronous operation and BE read operations. During a BE write operation, an externally provided address is routed through master latch 302, multiplex circuit 352, slave latch 306, register 308, and master latch 310 to multiplex circuit 304. The input (1) of the multiplex circuit 304 is then coupled to array address line 303 through slave latch 312. Control of address register 340 allows the memory to function as either a synchronous memory or a BE memory, both options can function as pipelined or non-pipelined. A feed-back path is provided from array address line 303 to a multiplex circuit 348 and burst logic 108. Likewise, a feedback path is provided from latch 306. Burst logic 108 increments the address received from either array address line 303 or latch 306 and provides this incremented address to multiplex circuit 352. Thus, an internally generated address can be used to burst read or write data. The burst logic 108 receives input from latch 312 during synchronous and BE read operations, and receives addresses from latch 306 during BE write operations. The operation of circuit 340 is substantially the same as circuit 300, during non-burst operations. The operation and control of circuits 300 and 340 are described below with reference to timing diagrams.

Figure 7:
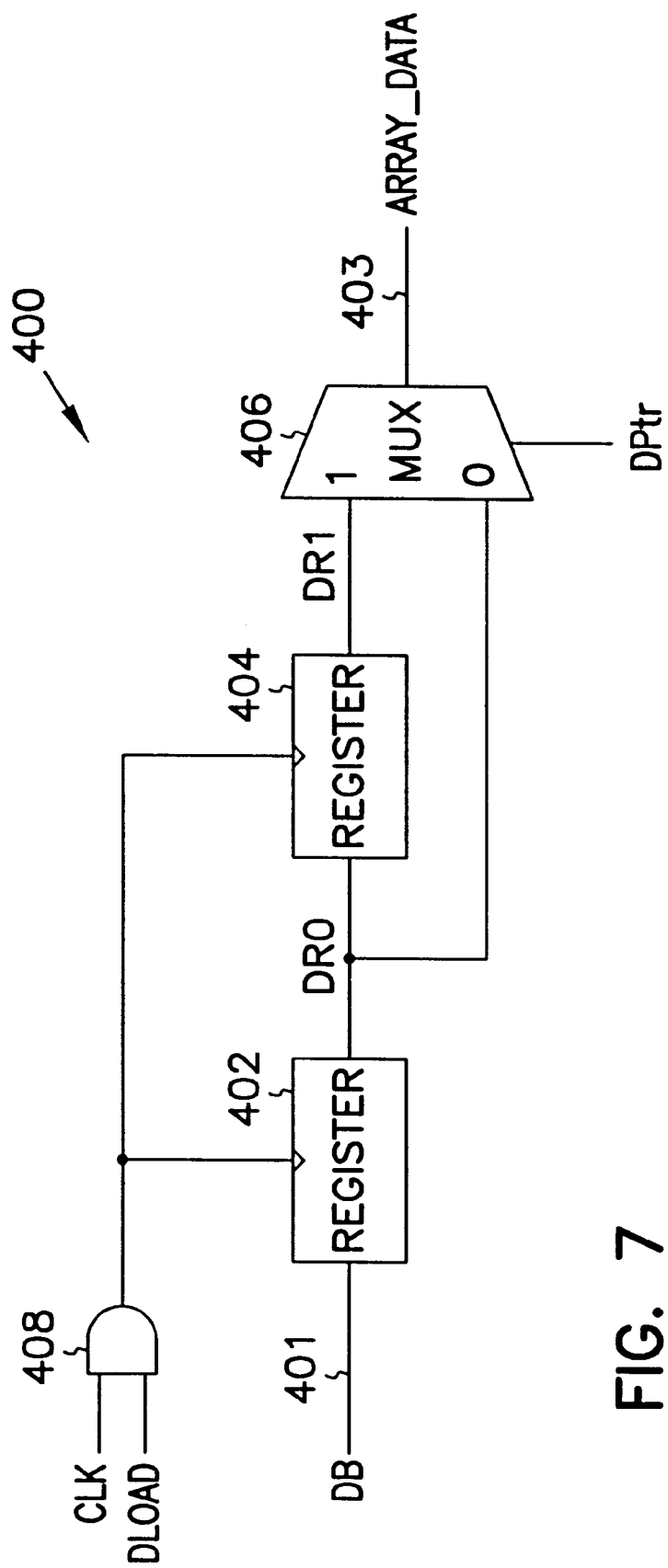
FIG. 7 is a schematic diagram of a data register circuit of the present invention.

FIG. 7 is a schematic diagram of an input data register circuit 400. The data register has two data paths from data bus 401 to array data line 403. The first path is defined by register 402 and multiplex circuit 406. The second data path is defined by register 402, register 404 and multiplex circuit 406. The first path is used during synchronous and BE pipelined operations, and the second path is used during BE pipelined and non-pipelined operation. Both registers are loaded in response to the system clock and a data load signal (DLoad). The operation of the data register is explained below.

Figure 8:
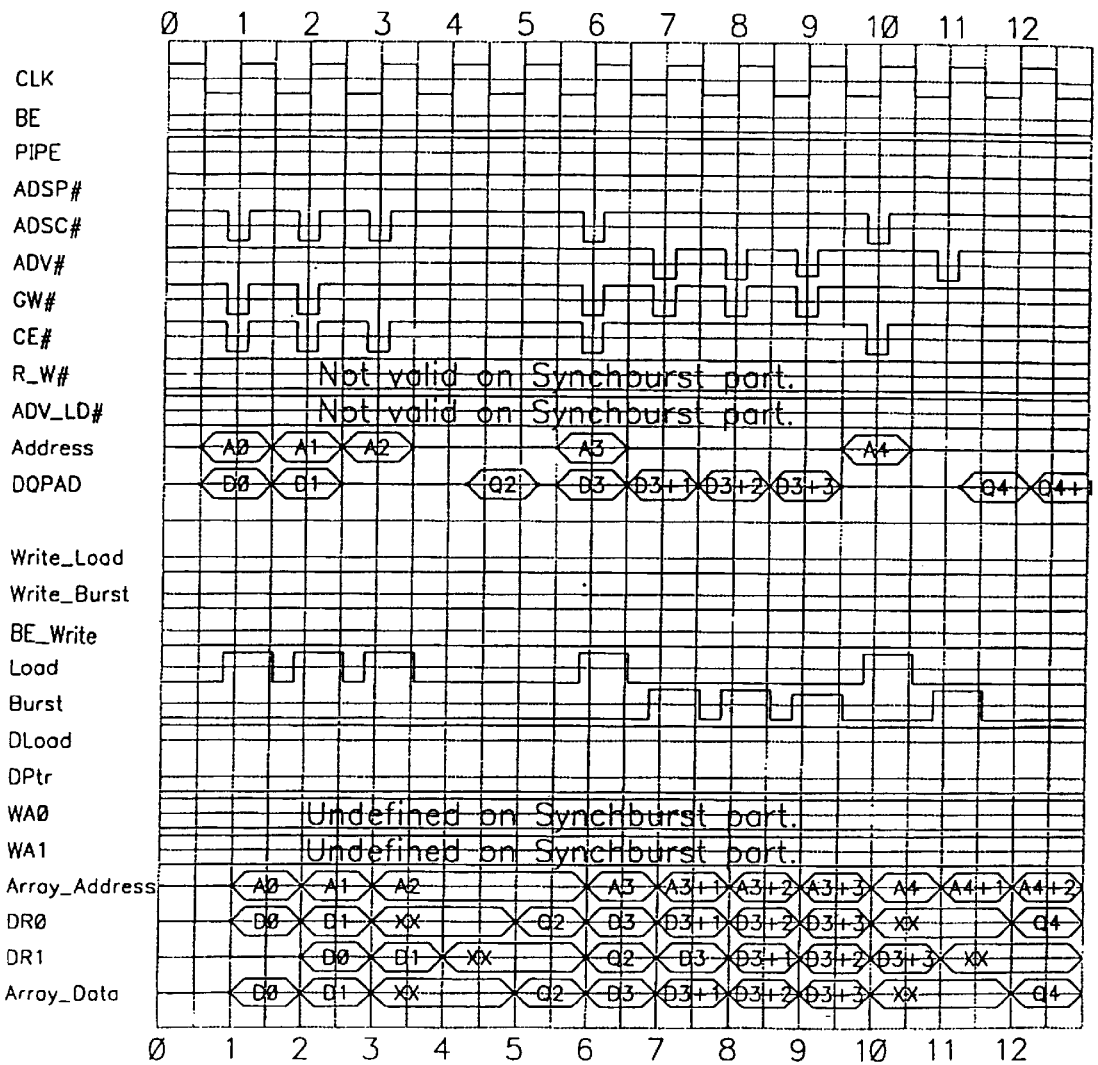
FIG. 8 is a timing diagram illustrating operation of the memory of FIG. 1 during synchronous operation.
Figure 9:
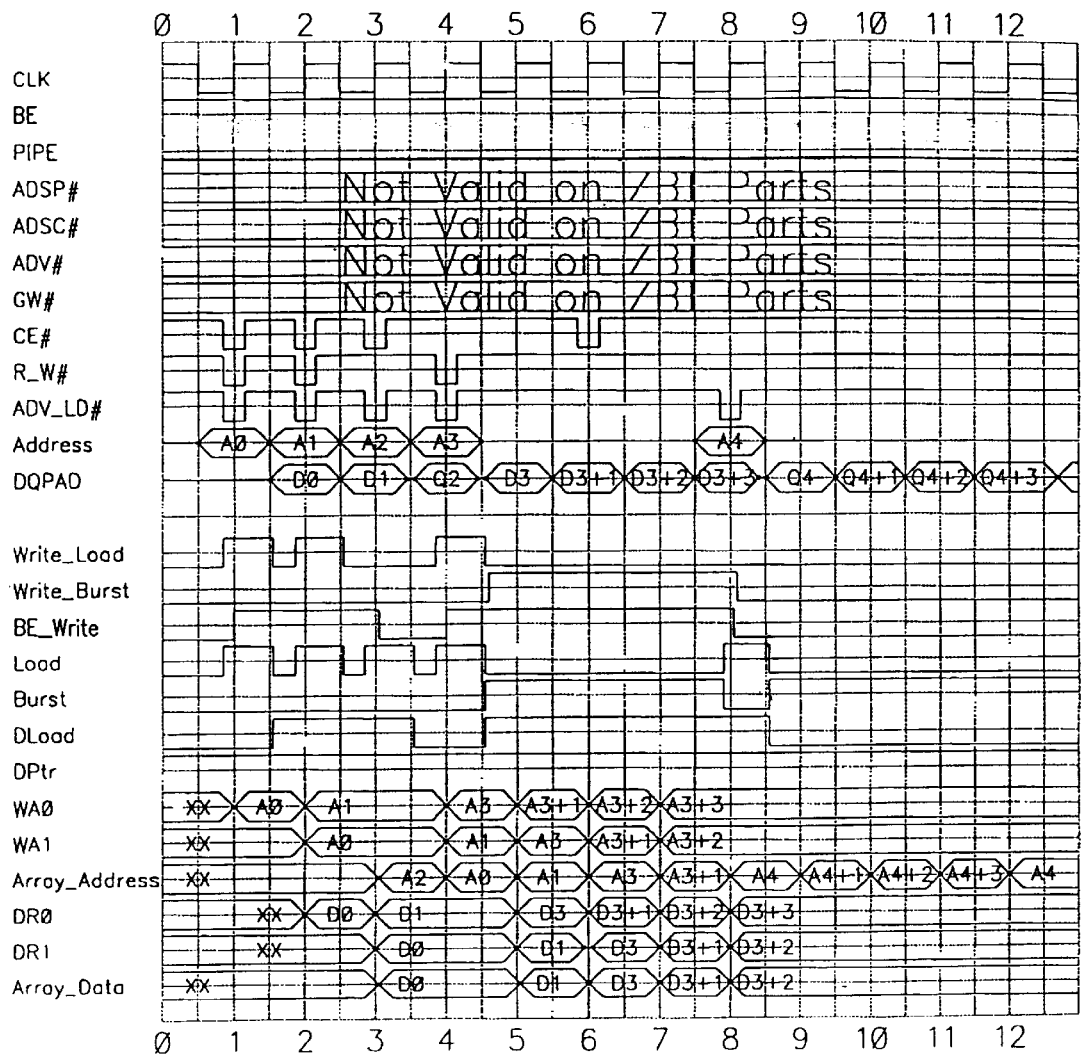
FIG. 9 is a timing diagram illustrating operation of the memory of FIG. 1 during BE non-pipelined synchronous operation.
Figure 10:
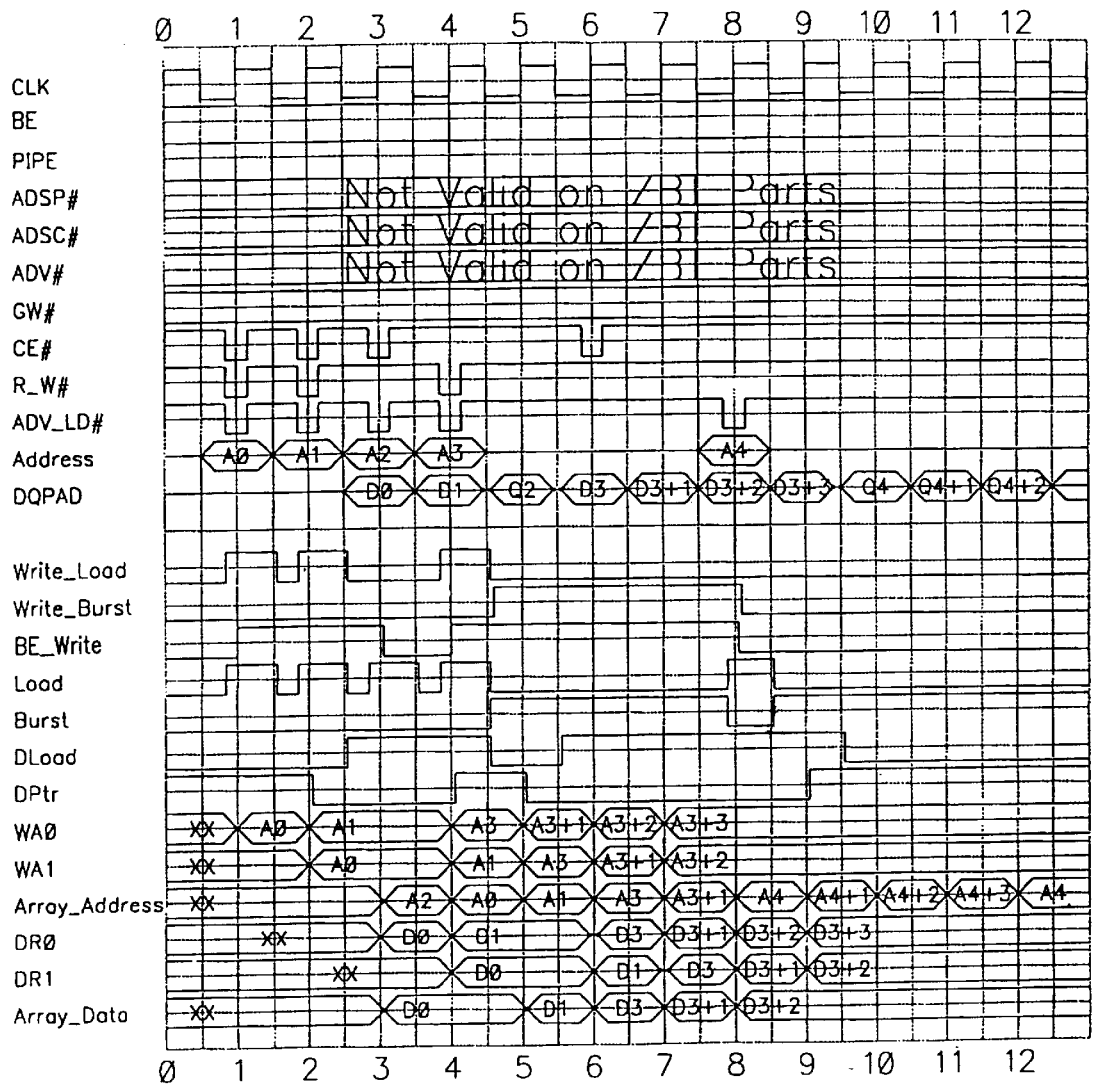
FIG. 10 is a timing diagram illustrating operation of the memory of FIG. 1 during BE pipelined synchronous operation.

Prior to describing the timing operation of the memory of the present invention, the external input signals illustrated in FIGS. 8–10 are explained. The BE input is used to identify if the memory is operating in a BE mode, thus the signal will be high during BE operations and low during synchronous operations. The PIPE signal is provided to indicate whether the memory device is operating in a pipeline mode. As such, the signal is high while operating in a pipeline mode, and is low during a flow through mode. The ASDP# signal is a synchronous address status processor signal active low input which interrupts any ongoing burst, causing a new external addressed to be registered. A read operation is performed using the new address depending upon other input signals such as chip enable, CE#. The ADSC# input signal is an active low synchronous address status control signal which interrupts an ongoing burst and causes a new external address to be registered. A read or write operation is performed using the new address if all chip enables are active. The synchronous address advance signal, ADV#, is used to advance the internal burst counter and control burst access after the external address is loaded. When the ADV# signal is in a high state, a wait state is generated (no address advance). ADV# must be high at the rising edge of the first clock after a ADSP# cycle is initiated if a write cycle is desired to a loaded address. A global write signal, GW#, is an active low input which allows a global write operation to occur.

During BE operations, ADV_LD# is a synchronous address advance/load signal. This signal (when high) is used to advance the internal burst counter, and controls burst accesses after and external address is loaded. Further, when this is signal is in a high state, a R/W# input is ignored. A new address is permitted to be loaded on the rising edge of the system clock when ADV_LD# is low. The R/W# signal determines the read or write cycle type when ADV_LD# is low. This is the only means for determining read and write operations during BE modes. Read operations may not be converted into write operations (and vice versa) other than by loading a new address.

The following is a brief description of the internal signals provided in the memory. The Write_Load signal is an active high signal used to load an address during a BE operation. The Write_Burst signal is an active high signal which indicates a burst operation while the memory is operating as a BE memory. The BE_Write signal is active when writing to the memory during a BE mode. The Load signal is active when loading a new address from the external address bus. Likewise, the Burst signal is active during burst cycles. DLoad is always active while the memory device is operating in the synchronous mode, and is only active during a BE mode when new data is available. The data pointer (DPtr) signal points to the data register, via a multiplex circuit 406, which contains data to be written to the array as specified by the mode selected.

Timing Operations

The circuitry of FIGS. 5–7 are more fully understood with reference to the timing diagrams of FIGS. 8–10. FIG. 8 illustrates the operation of the memory device in a synchronous mode. First note that during a non-BE operation, the BE_Write signal is low and multiplex circuit 304 couples input (0) to slave latch 312. Thus, the first address path is completed and the second path is isolated from the array address line 303. To illustrate the data bus difference between synchronous and BE operations, note that idle times are present on the DQPAD. For example, the data bus is idle for more than 1½ clock cycles between the receipt of data D1 and the output of data Q2. This idle time is eliminated in the BE mode, as illustrated below.

Referring to FIGS. 5–8, the operation of the memory in a synchronous read and write mode is described. As explained above, during a non-BE operation, the BE_Write signal is low and multiplex circuit 304 couples input (0) to slave latch 312. As such, the first address path, as defined above, through register circuit 340 is utilized. Prior to the rising edge (1) of the clock signal, address A0 is provided on the address bus, and data D0 is provided on the DQPAD coupled to the external data bus. The address, therefore, is latched by master latch 302 and coupled to multiplex circuit 304. On the rising edge of the clock signal (1), the output of multiplex circuit 304 is latched in slave latch 312 for coupling to the Array_Address lines 303. Likewise, the data (D0) is loaded into register 402 and coupled through multiplex circuit 406 to the Array_Data line 403. On the next clock cycle, address A1 and corresponding data D1 are received and coupled in the same manner to the Array_Address lines and the Array_Data lines.

On the third rising clock edge (3), the GW# signal is high indicating a read operation. Address A2 is coupled through circuit 300 to Array_Address lines 303, as described above. Note, however, that the data bus line is idle until output data Q2 is available. Subsequent to the read operation, a burst write operation is initiated at address A3. Address A3 and corresponding data D3 are coupled through circuit 300 as described above. On the next three clock cycles data D3+1, D3+2 and D3+3 are coupled to the Array_Data line 403 through input register 400. The corresponding addresses A3+1, A3+2 and A3+3 are generated using burst logic 108. Upon completion of the uninterrupted burst write operation, a burst read operation is initiated starting at externally provided address A4.

As illustrated, the memory of FIG. 1 can be operated in a synchronous mode where data can be read or written in individual or burst modes. Externally provided addresses are coupled to an internal Array_Address bus using a first address path through circuit 300. Input data is coupled to an internal array data bus via the first single register path, as described above. Using the same circuitry provided on a common integrated circuit, the memory of FIG. 1 can be operated in a BE mode to eliminate idle time on the external data bus.

Referring to FIG. 9, the BE non-pipelined (flow through) operation of the memory of the present invention is described. As described above, an externally provided address is received by the memory device one clock cycle ahead of corresponding data. It can be seen in FIG. 9 that the initial address A0 is received one cycle before its corresponding data D0. During BE operation, the synchronous controls ADSP#, ADSC#, ADV# and GW# are not valid. The BE signal is high during BE operation, and the PIPE signal is low during non-pipelined operation. The timing diagram of FIG. 9 illustrates the same operations of the timing diagram of FIG. 8. That is, two write operations are followed by a read operation, which is followed by a burst write, and a burst read operation.

During the first write operation, address A0 is received and latched by master latch 302. On the first rising edge of the clock signal (Write_Load is high), the address is latched in slave latch 306. On the next rising edge of the clock signal (Write_Load is high), register 308 latches address A0 and slave latch 306 latches address A1. At the same time, data D0 is loaded into register 402. Because multiplex circuit 406 is coupling input (1) to the Array_Data line 403, data D0 is not coupled to line 403.

Prior to coupling data D0 to the internal data lines, a read operation is initiated at a new address A2. Addresses A0 and A1 remain latched in latch 306 and register 308 until the read operation is completed. Data D0 is latched in register 404 and D1 is received and latched in register 402. Received address A2 is coupled from master latch 302 through multiplex circuit 304 to the Array_Address line 303. That is, the read address follows the first address path through circuit 300.

On the fourth rising edge of the clock signal, address A0 is coupled to the Array_Address line 303 through multiplex circuit 304 and latch 312. Addresses A1 and A3 are coupled through the second address path of circuit 300 in the same manner. Because a burst write operation is initiated on address A3, the internal burst address generator provides address A3+1. Prior to coupling additional burst addresses to the internal Array_Address line, a burst read operation is initiated at address A4. Thus, the write burst address signals and corresponding burst write data, for addresses A+x, remain latched until completion of the burst read operation. It should be noted that the burst read operation repeats itself starting at address A4 until terminated. During BE non-pipelined operation, read addresses follow the first address pass through circuit 300, write addresses follow the second address path, and that write data follows the second data path through circuit 400. The circuitry, therefore, is operated in a different manner than the above described synchronous operation.

Turning now to FIG. 10, a BE pipelined operation is described. The primary difference between this BE operation and the non-pipelined operation is that the data received on the external data bus lags the corresponding address on the external address bus by two clock cycles. The address propagation through circuit 300 is the same for both BE operations, however, the corresponding data propagates through the first and second data path of circuit 400. The data register path is controlled by the data pointer signal, DPtr. During BE pipelined operations, the DPtr points to register 402 if a write cycle was performed during the previous cycle, and the DPtr points to register 404 if the previous cycle was not a write. That is, the DPtr signal transitions to a low state following a write, and returns to a high state following a non-write (read or no op). As such, the data on Array_Address and Array_Data lines of FIGS. 9 and 10 are the same, with a write address and its corresponding data synchronized on the same system clock cycle.

Figure 11:
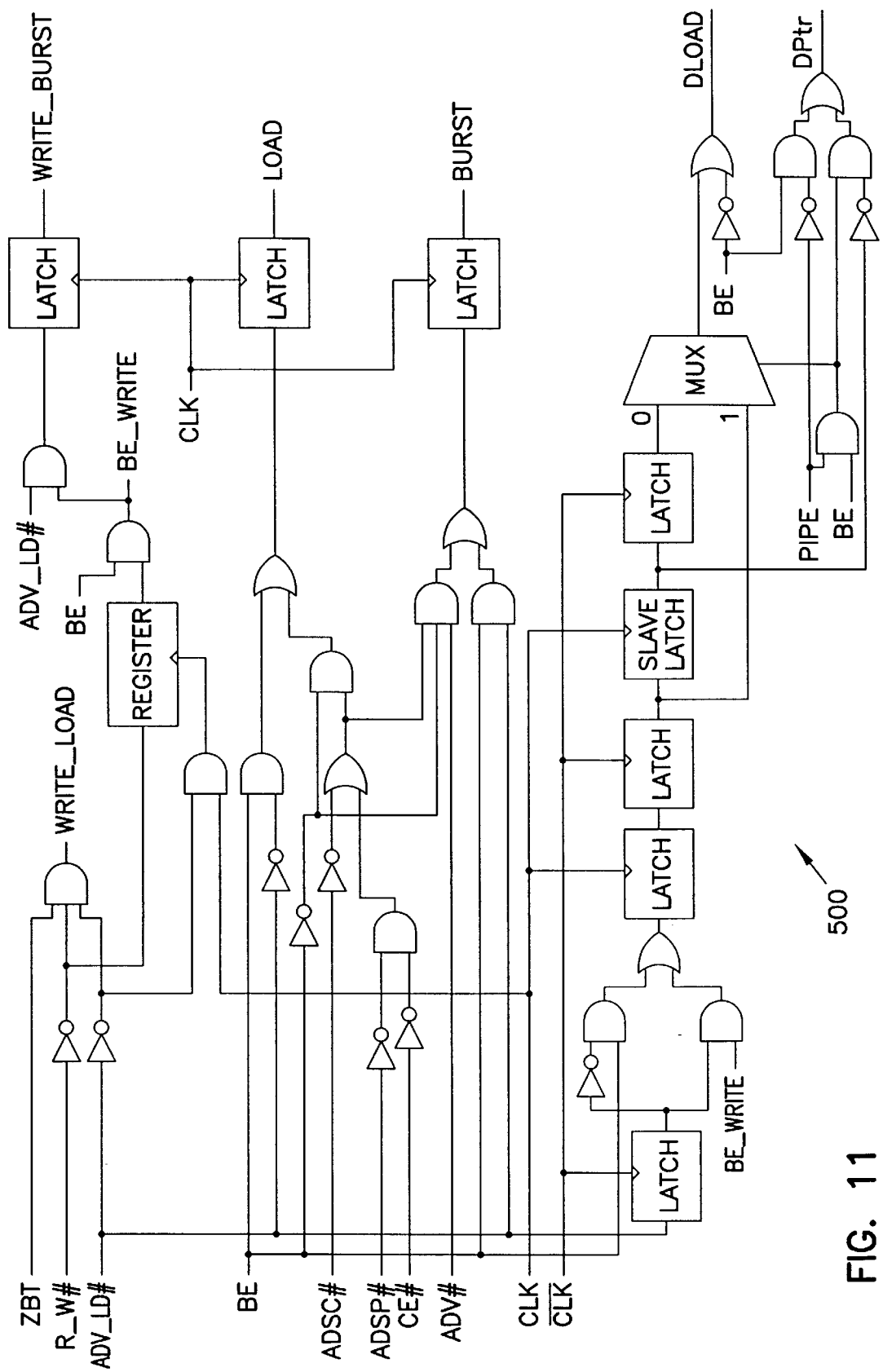
FIG. 11 is a schematic diagram of circuitry of the present invention.

FIG. 11 illustrates one embodiment of control circuitry 500 for operating the memory of the present invention according to the timing diagrams of FIGS. 8–10. It is believed that one skilled in the art, by studying the schematic of FIG. 11 and the timing diagrams described above, will readily understand the operation of the control circuitry 500. As such, a detailed description of the logic circuitry 500 is not provided herein. It is noted, however, that the externally provided control signals described herein, are used to generate the internal signals coupled to the circuitry of FIGS. 5–7. As indicated above, R_W# and ADV_LD# are input pins provided for BE operations, and ADSC#, ADSP# and CE# are input pins for synchronous operations. Again, a high PIPE signal indicates a pipelined mode, and a high BE signal indicates a BE mode of operation. DLoad is active on every cycle during synchronous operation, and is active only when new data is arriving during BE mode. Finally, DPtr points to data register 402 for synchronous operation, and points to data register 404 on BE non-pipelined operation. During BE pipelined operations, the DPtr points to register 402 if a write cycle was performed during the previous cycle, and the DPtr points to register 404 if the previous cycle was not a write.

CONCLUSION

A memory device has been described which is operable in both a synchronous mode and a bus efficient mode (BE). Address and data register circuitry provide multiple propagation paths which can be selected based upon the operating mode and function performed. These features allow one memory device to be manufactured for multiple commercial applications. The address and data register circuitry have first and second paths, wherein the second paths are longer than the first paths. During a synchronous and BE read operations, the first path of both the address and data register circuitry is selected. During BE write operations, the second path of the address register circuitry is selected. If the BE is operating in non-pipelined mode, the second path of the data register circuitry is selected. Finally, if the BE is operating in a pipelined mode, the first path of the data register circuitry is selected following a write operation, and the second path of the data register circuitry is selected following a read operation.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A memory device comprising:
    address register circuit comprising,
        an input node for receiving an address input signal,
        a first latch circuit coupled to the input node, and
        a second latch circuit coupled to an output node of the address register circuit, the second latch circuit receives an address signal from the first latch circuit via first or second address propagation paths, the second address propagation path is longer than the first data propagation path;
    a data register circuit; and
    control circuitry coupled to the address register to control the second address propagation path, the control circuitry is also coupled to the data register circuit.

2. The memory device of claim 1 further comprising a burst address generator circuit for advancing an externally provided address.

3. The memory device of claim 1 wherein the data register circuit comprises first and second data propagation paths.

4. The memory device of claim 1 wherein the second latch circuit receives the address signal from the first latch circuit via the first address propagation path when the memory device is operating in a synchronous mode.

5. The memory device of claim 1 wherein the second latch circuit receives the address signal from the first latch circuit via the first address propagation path when the memory device is performing a read function while operating in a bus efficient mode.

6. The memory device of claim 1 wherein the second latch circuit receives the address signal from the first latch circuit via the second address propagation path when the memory device is performing a write function while operating in a bus efficient mode.

7. The memory device of claim 1 wherein the second latch circuit receives the address signal from the first latch circuit via the first address propagation path when the memory device is operating in a synchronous mode.

8. The memory device of claim 1 wherein the second latch circuit receives the address signal from the first latch circuit via the second address propagation path when the memory device is operating in a non-pipelined bus efficient mode.

9. The memory device of claim 1 wherein the second latch circuit receives the address signal from the first latch circuit via either the first or second data propagation path when the memory device is operating in a pipelined bus efficient mode.

10. The memory device of claim 1 wherein the second address propagation path comprises:
    a third latch circuit coupled to the first latch circuit;
    a register coupled to an output of the second latch circuit; and
    a fourth latch circuit coupled to the register.

11. The memory device of claim 10 further comprising a multiplex circuit having a first input coupled to the first latch, a second input coupled to the fourth latch, and an output coupled to the second latch.

12. The memory device of claim 10 further comprising:
    a first multiplex circuit having a first input coupled to the first latch, a second input, and an output coupled to the third latch circuit,
    a second multiplex circuit having a first input coupled to the output of the first multiplex circuit, a second input coupled to the fourth latch, and an output coupled to the second latch.

13. The memory device of claim 12 further comprising burst circuitry coupled to the second input of the first multiplex circuit.

14. The memory device of claim 1 wherein the data register circuit comprises:
    a first register having an input node to receive a data signal;
    a second register having an input node coupled to an output of the first register;
    and a multiplex circuit having a first input coupled to the output of the first register, and a second input coupled to an output of the second register.

15. A memory device comprising:
    address register circuit comprising,
        an input node for receiving an address input signal,
        a first latch circuit coupled to the input node for receiving an address signal,
        a second latch circuit coupled to an output node of the first latch circuit,
        a register coupled to an output node of the second latch circuit,
        a third latch circuit coupled to an output node of the register,
        multiplex circuit having a first input coupled to the output node of the first latch, a second input coupled to the output node of the third latch, and an output node, and
        a fourth latch circuit having an input node coupled to the output node of multiplex circuit;

a data register circuit; and control circuitry coupled to the address register to control the address register circuit, the control circuitry is also coupled to the data register circuit.

16. The memory device of claim 15 wherein the data register circuit comprises:

a first register having an input node to receive a data signal;

a second register having an input node coupled to an output of the first register;

and a multiplex circuit having a first input coupled to the output of the first register, and a second input coupled to an output of the second register.

17. A memory device comprising:

address register circuit comprising,
an input node for receiving an address input signal,
a first latch circuit coupled to the input node for receiving an address signal,
a first multiplex circuit having a first input coupled to an output node of the first latch circuit, a second input, and an output node,
a second latch circuit coupled to an output node of the first multiplex circuit;
a register coupled to an output node of the second latch circuit;
a third latch circuit coupled to an output node of the register;
a second multiplex circuit having a first input coupled to the output node of the first multiplex circuit, a second input coupled to the third latch, and an output node, and
a fourth latch circuit coupled to the output node of the second multiplex circuit;

a data register circuit; and control circuitry coupled to the address register to control the address register circuit, the control circuitry is also coupled to the data register circuit.

18. The memory device of claim 17 further comprising burst circuitry coupled to the second input of the first multiplex circuit.

19. The memory device of claim 17 wherein the data register circuit comprises:

a first register having an input node to receive a data signal;

a second register having an input node coupled to an output of the first register;

and a multiplex circuit having a first input coupled to the output of the first register, and a second input coupled to an output of the second register.

20. A static random access memory (SRAM) operable in both a synchronous mode and a bus efficient mode, the SRAM comprising:

an array of static memory cells;

an address input connection coupled to an external address bus;

a data input connection coupled to an external data bus;

address register circuit comprising,
an input node for receiving an address input signal,
a first latch circuit coupled to the input node, and
a second latch circuit coupled to an output node of the address register circuit, the second latch circuit receives an address signal from the first latch circuit via first or second address propagation paths, the second address propagation path is longer than the first data propagation path;

a data register circuit comprising a controllable propagation time; and control circuitry coupled to the address register to control the second address propagation path, the control circuitry is also coupled to the data register circuit.

21. The static random access memory of claim 20 wherein the control circuitry controls the propagation times of the address register circuit and the data register circuit in response to an operating mode of the static random access memory.

* * * * *